United States Patent [19]

Awano

[11] Patent Number: 5,296,390
[45] Date of Patent: Mar. 22, 1994

[54] METHOD FOR FABRICATING A SEMICONDUCTOR DEVICE HAVING A VERTICAL CHANNEL OF CARRIERS

[75] Inventor: Yuji Awano, Tokyo, Japan

[73] Assignee: Fujitsu Limited, Kawasaki, Japan

[21] Appl. No.: 61,250

[22] Filed: May 17, 1993

Related U.S. Application Data

[62] Division of Ser. No. 682,254, Apr. 9, 1991, Pat. No. 5,212,404.

[30] Foreign Application Priority Data

Apr. 9, 1990 [JP] Japan .................. 2-92049

[51] Int. Cl.[5] .......................................... H01L 21/265
[52] U.S. Cl. ............................... 437/31; 437/126; 437/133; 437/110; 437/909; 437/911; 148/DIG. 72
[58] Field of Search ............... 437/31, 126, 133, 108, 437/110, 6, 909, 911; 148/DIG. 72

[56] References Cited

U.S. PATENT DOCUMENTS

| | | | |
|---|---|---|---|
| 4,378,629 | 4/1983 | Bozler et al. | 357/22 E |
| 4,712,122 | 12/1987 | Nishizawa et al. | 437/133 |
| 4,758,534 | 7/1988 | Derkits, Jr. et al. | 357/56 |
| 4,785,340 | 11/1988 | Nakagawa et al. | 357/4 |
| 4,872,046 | 10/1989 | Morkoc et al. | 357/60 |
| 4,903,090 | 2/1990 | Yokoyama | 357/22 E |
| 4,937,204 | 6/1990 | Ishibashi et al. | 357/34 |
| 4,987,094 | 1/1991 | Colas et al. | 437/133 |
| 5,026,655 | 6/1991 | Ohata | 437/126 |
| 5,032,538 | 7/1991 | Bozler et al. | 357/22 E |
| 5,100,831 | 3/1992 | Kuwata | 437/126 |
| 5,168,070 | 12/1992 | Lüth | 437/31 |
| 5,238,869 | 8/1993 | Shichijo et al. | 437/126 |

FOREIGN PATENT DOCUMENTS

| | | | |
|---|---|---|---|
| 2613537 | 10/1988 | France . | |
| 60-22377 | 2/1985 | Japan . | |
| 60-41264 | 3/1985 | Japan . | |
| 1-36377 | 5/1989 | Japan . | |
| 0097028 | 4/1990 | Japan | 437/126 |
| 0140941 | 5/1990 | Japan | 437/126 |
| 2-156573 | 6/1990 | Japan . | |
| 0105915 | 5/1991 | Japan | 437/133 |
| 0105313 | 4/1992 | Japan | 437/133 |

OTHER PUBLICATIONS

*IBM Technical Disclosure Bulletin*, vol. 31, No. 5, Oct. 1988, "Multiple Grid Permeable Transistor," pp. 40–43.

Primary Examiner—Brian E. Hearn
Assistant Examiner—Tuan Nguyen
Attorney, Agent, or Firm—Staas & Halsey

[57] ABSTRACT

A semiconductor device comprises a substrate having a stepped upper major surface, an emitter layer of a semiconductor material provided on the stepped upper major surface of the substrate and having a corresponding stepped upper major surface, a base layer provided on stepped upper major surface of the emitter layer and comprising a plurality of channels of carriers and a plurality of control regions for controlling the passage of carriers through the control regions, and a collector layer of a semiconductor material provided on the base layer for collecting the carriers that have passed through the channels. Each channel extends from the emitter layer to the collector layer, and at least one channel and one control region are provided adjacent with each other in correspondence to each step of the upper major surface of the emitter layer.

2 Claims, 9 Drawing Sheets

METHOD FOR FABRICATING A SEMICONDUCTOR DEVICE HAVING A VERTICAL CHANNEL OF CARRIERS

This application is a division of application Ser. No. 07/682,254, filed Apr. 9, 1991, now U.S. Pat. No. 5,212,404 issued May 18, 1993.

BACKGROUND OF THE INVENTION

The present invention generally relates to semiconductor devices, and in particular to an improvement of high-frequency power semiconductor devices such as permeable base transistors or static induction transistors having a vertical channel of carriers, but not limited to these.

Permeable base transistors or static induction transistors are promising semiconductor devices that are capable of operating at high frequencies with a large output power. On the other hand, these devices have various fabrication problems because of the peculiar device structure.

FIG. 1 shows the essential part of a permeable base transistor disclosed in the U.S. Pat. No. 4,378,629.

Referring to FIG. 1, the transistor comprises an n+-type GaAs substrate 11 on which an n-type GaAs layer 12a is grown. The GaAs layer 12a is made unconductive by the ion implantation of protons except for a part 13 that is used for the emitter of the permeable base transistor. Thereby, the rest of the GaAs layer 12a acts as the device isolation region.

On the GaAs layer 12a, a tungsten base layer is deposited with the thickness of less than about 2000 Å, and the tungsten layer is patterned by a photolithographic process to form a base structure 14 wherein a number of fingers 14a are formed to extend parallel with each other along the top surface of the emitter region 13. Further, another n-type GaAs layer 12b is deposited on the GaAs layer 12a to bury the base structure 14, and a groove 12c is formed in the GaAs layer 12b to expose a part of the tungsten base structure 14.

The GaAs layer 12b is rendered unconductive by the ion implantation of protons except for a collector region 15 that is located in the layer 12b to oppose the emitter region 13 across the base structure 14, and a base electrode 17 and a collector electrode 18 are provided respectively in contact with the base structure 14 and the collector region 15. It should be noted that the base electrode 17 is provided along the sloped surface of the groove 12c to contact with the base structure 14 exposed at the bottom part thereof. Further, an emitter electrode 16 is provided on the bottom surface of the substrate 11.

Typically, the base structure 14 has a thickness of less than 1000 Å as already described, and the fingers 14a are separated from each other by 0.32 $\mu$m for example. The electrons are transported vertically from the emitter region 13 to the collector region 15, passing through a channel region 20 formed between adjacent fingers 14a of the base structure. Thereby, the electrons experience the electric field that is formed by the base structure 14 in response to a base voltage applied thereto.

As the thickness of the base structure 14 in the vertical direction can be easily reduced to less than 2000 Å at the time of deposition of the tungsten layer, the transistor of FIG. 1 has an excellent high frequency characteristic. Further, the device is characterized by the large number of channels that is formed between the fingers 14a of the base structure 14. Thereby, a large output power can be obtained while maintaining the small lateral size of the base structure 14. About the permeable base transistor, reference should be made to IEEE MTT-S Digest, 1988, which is incorporated herein by reference.

The static induction transistor has a structure substantially identical with that of FIG. 1 except that the base structure 14 is formed of an p-type semiconductor material, and the emitter region 13, the collector region 15 and the channel region 20 are all formed from an undoped or lightly-doped n-type semiconductor material. About the static induction transistor, reference should be made to Nishizawa et al. (Nishizawa, J. I., et al., IEEE Transactions on Electron Devices, vol.ED-22, No.4, p.185, 1975), which is incorporated herein by reference.

In the foregoing permeable base transistors or static induction transistors, there exists a problem in that the fabrication of the device is difficult because of the complex device structure, particularly the base structure 14, and associated therewith, there is another problem in that impurities tend to be incorporated in the critical part of the device during fabrication. It should be noted that the base structure 14 has to be embedded between the GaAs layer 12a and the GaAs layer 12b, after depositing and patterning the tungsten layer on the GaAs layer 12a. This means that the device has to be removed from the deposition apparatus to the atmospheric environment for photolithographic patterning. Thereby, contamination of the surface of the layer 12a by atmospheric impurities such as carbon or oxygen is inevitable and such impurities cannot be removed perfectly even after a meticulous cleaning process.

FIG. 2 shows such impurities 19 in the case of the device wherein the base structure 14 is formed directly on the top surface of the GaAs layer 13, and FIG. 3 shows the impurities 19 in the device wherein the base structure 14 is formed in a groove 13a formed on the top surface of the GaAs layer 13. In these examples, the impurities 19 exist in the channels 20 of the electrons, and because of this, the passage of the electrons through the channels 20 is inevitably affected by the impurities. These impurities may for example form the deep impurity levels in the channels 20 that in turn cause the modification of the band structure such as the formation of depletion regions within the channels 20. Further, the impurities may cause the scattering of the carriers passing through the channels 20.

SUMMARY OF THE INVENTION

Accordingly, it is a general object of the present invention to provide a novel and useful semiconductor device wherein the foregoing problems are eliminated.

Another and more specific object of the present invention is to provide a semiconductor device having a vertical channel region sandwiched vertically between an emitter region and a collector region, wherein the emitter region, the channel region and the base region can be formed successively in a same deposition apparatus without interrupting the process of growth. According to the present invention, the layered semiconductor body forming the essential part of the device can be formed without taking the device out of the deposition apparatus during the fabrication of the device. Thereby, the chance that the partially formed semiconductor device will be contaminated by the impurities is substantially eliminated.

Another and more specific object of the present invention is to provide a semiconductor device having a vertical channel region of carriers between an emitter region and a collector region, wherein the emitter region has a stepped upper major surface including a number of steps each having the (100) surface as the upper major surface, and the channel region comprises a fractional superlattice structure. According to the present invention, the formation of the channel layer, comprising the alternate repetition of fractional superlattice layers that are repeated laterally with respect to the upper major surface of the collector region, can be made to continuously and immediately follow after the formation of the emitter layer, without creating chance for the impurities to contaminate the device.

Other objects and further features of the present invention will become apparent from the following detailed description when read in conjunction with the attached drawings.

DETAILED DESCRIPTION

Figure 4:
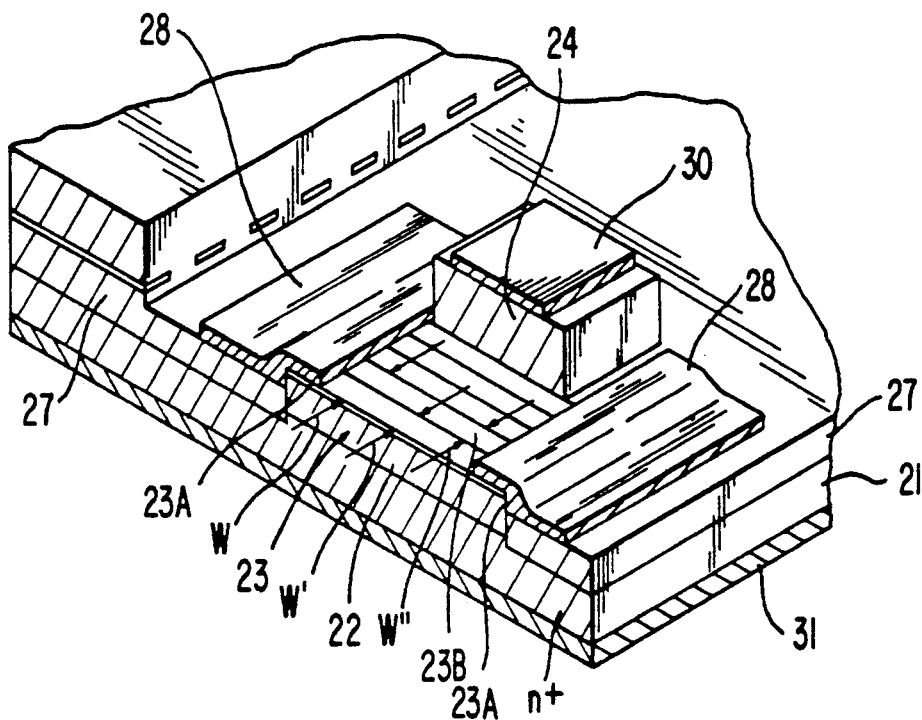
FIG. 4 is a diagram showing the perspective view of the permeable base transistor according to a first embodiment.
Figure 2:
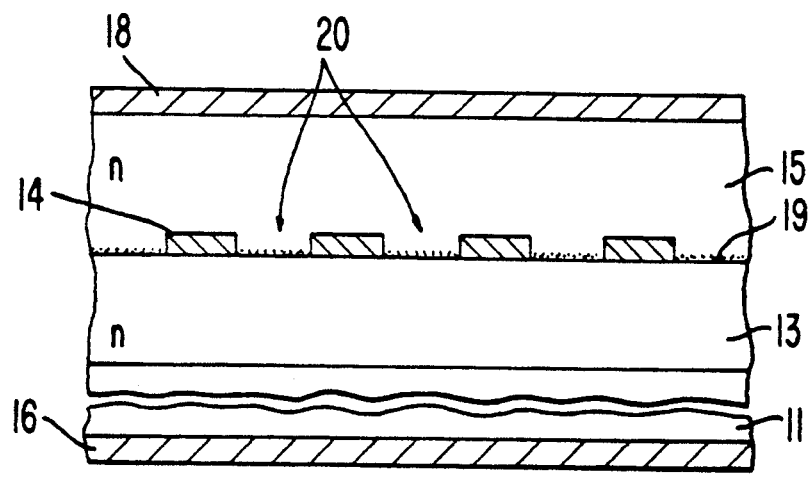
FIG. 2 is a diagram showing the cross-sectional view of the device of FIG. 1.

FIG. 4 shows the structure of a permeable base transistor according to a first embodiment of the present invention in the perspective view.

Referring to FIG. 4, the permeable base transistor has a substrate 21 of n+-type GaAs on which an emitter region 22 of n-type GaAs is provided. As illustrated, the emitter region 22 forms a mesa structure 23A projecting in the upward direction relative to a region 27 that surrounds the emitter region 22 laterally. The region 27 is formed of GaAs that is rendered unconductive by the ion implantation of protons. Thereby, the region 27 acts as the isolation region. The GaAs isolation region 27 is provided on the upper major surface of the substrate 21 excluding the mesa structure 23A.

On the emitter region 22, a base structure 23 comprising an alternate repetition of a NiAl strip 23A and an n-type GaAs strip 23B is provided. It should be noted that the NiAl strip 23A and the n-type GaAs strip 23B extend parallel with each other to form a lateral superlattice structure, with respective widths w' and w" set typically to 80 nm and 80 nm and overall pitch W defined as a sum of w' and w" set to 160 nm. Here, it should be noted that the material of the strip 23A is not limited to NiAl but may be any metal having a large surface diffusion length on the semiconductor surface and growing on the semiconductor material according to the Frank-Vander-Merve process or Stranski-Krastanov process, and forming a Schottky contact with the semiconductor material.

On the base structure 23, a collector region 24 of n-type GaAs is provided except for the part of the base structure 23 used for external connection, and a collector electrode 30 is provided on the upper major surface of the collector region 24 in ohmic contact therewith. Further, a base electrode 28 is provided on the upper major surface of the isolation 27 in contact with the exposed part of the base structure 23. Thereby, the base electrode 28 establishes an electric connection to each of the NiAl strips 23A of the bas structure 23. Further, on the lower major surface of the substrate 21, an emitter electrode 31 is provided in ohmic contact therewith.

Figure 1:
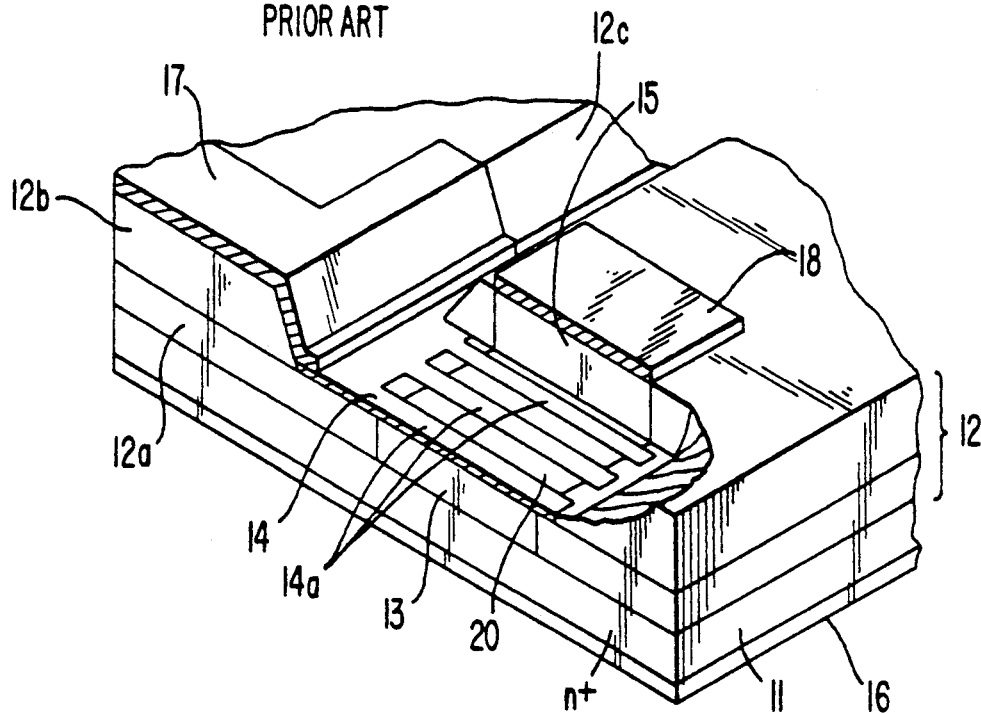
FIG. 1 is a diagram showing the perspective view of a conventional permeable base transistor.

In the permeable base transistor of the present embodiment, the base structure 23 does not employ the patterned metal structure such as the comb-shaped tungsten base 14 of FIG. 1. Instead, the base structure 23 is formed as the lateral superlattice structure of metal and semiconductor that can be grown in situ on the emitter region 23, without interrupting the growth process at the time of forming the base structure 23 and the collector region 24. Thereby, the chance that the contaminants and unwanted impurities are incorporated into the device structure is substantially eliminated. Further, the base structure 23 formed as the superlattice structure can provide an extremely small pitch for the NiAl strips 23A and the GaAs strips 23B that eventually leads to an improvement of the pinch-off characteristics of the transistor. Note that the pitch can be reduced by increasing the angle of offset of the upper major surface of the substrate 21 with respect to the (001) surface. Typically, the pitch w of 160 nm is achieved by setting the offset angle at 0.1 degrees as set forth previously, while a further smaller pitch of 16 nm is realized when the offset angle is chosen to be 1 degree. When the offset angle is set to 2 degrees, on the other hand, the pitch of 8 nm is achieved. Needless to say, the transistor inherits the various of advantages of the conventional permeable base transistor particularly in respect to the excellent high frequency characteristics due to the reduced thickness of the base structure 23 and the large output power due to the large number of channels formed in the base structure 23. It should be noted that the GaAs strips 23B serve for the channels of the electrons passing through the base structure 23.

Next, the fabrication of the device of FIG. 4 will be described, first with reference to FIGS. 5 through 7, and next with reference to FIGS. 8(A)–8(F).

Figure 5:
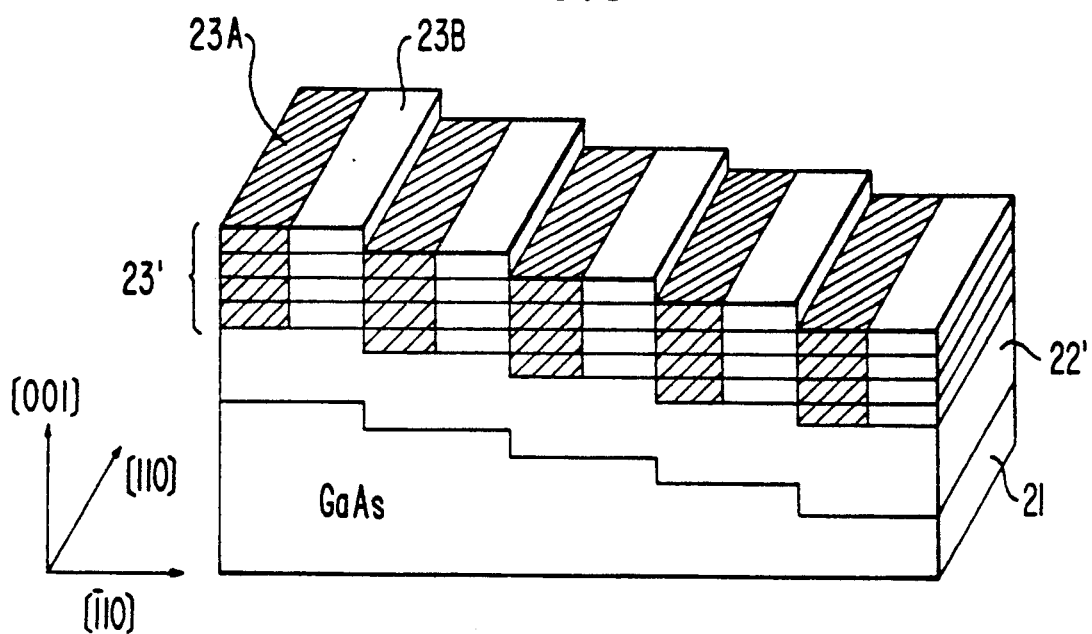
FIG. 5 is a diagram showing the fractional superlattice structure used in the permeable base transistor of FIG. 4.

FIG. 5 shows a part of the substrate 21 before the formation of the emitter region 22, the base region 23 and the collector region 24. As illustrated, the GaAs substrate 21 has the upper major surface thereof offset from the [001] direction in the [110] or [1̄10] direction with an offset angle of 0.1 degrees, and a number of stepped surfaces, each comprising a striplike (001) surface, appear to extend parallel with each other. Typically, the substrate 21 is doped to the n+-type by silicon with the impurity concentration level of $5 \times 10^{18}$ cm$^{-3}$.

On the stepped surface of the substrate 21, an n-type GaAs layer 22' to be used for the emitter region 22 is deposited, for example by the MBE process with a thickness of 3000 Å. The layer 22' is doped to the n-type by silicon with the impurity concentration level of $2 \times 10^{17}$ cm$^{-3}$. Thereby, the stepped surface of the substrate 21 is transferred to the upper major surface of the layer 22'.

Further, the NiAl strips 23A and the GaAs strips 23B are formed on the stepped upper major surface of the layer 22' to form a fractional superlattice layer 23', that is to be used for the base structure 23, with a thickness corresponding to 100–500 molecular layers. There, one NiAl strip 23A and one GaAs strip 23B are formed laterally adjacent with each other on each step, thus forming the fractional superlattice layer 23'.

Figure 6:
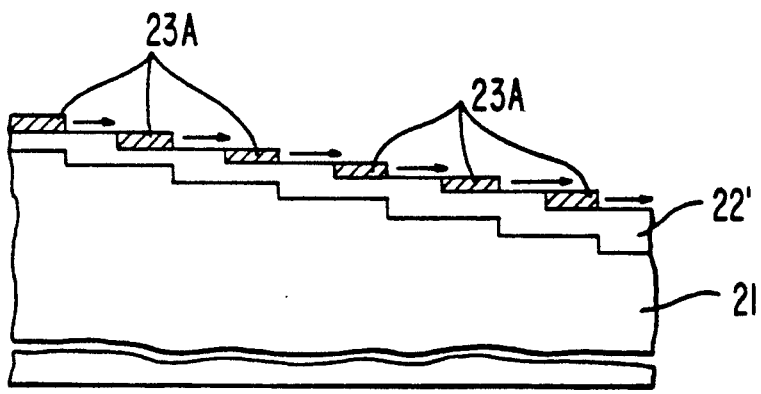
FIG. 6 is a diagram for explaining the formation of fractional superlattice structure of FIG. 5.

FIG. 6 shows the formation of the fractional superlattice layer 23' of FIG. 5.

Referring to FIG. 6, aluminum and nickel are deposited first by the MBE process on the stepped surface of the layer 22' with an amount to cover only one-half of each step. Thereby, aluminum and nickel are introduced into the deposition chamber of the same MBE apparatus that has been used for the growth of the layer 22', and the growth of the NiAl layer is made laterally along the major surface of each step as shown by arrows in FIG. 6, starting from the edge of each step. The NiAl layer 23A thus grown has a thickness corresponding to the height of each step. Such a mode of crystal growth is confirmed in various crystals including semiconductor materials and metals. Next, the deposition of NiAl is interrupted and the growth of n-type GaAs is started by the MBE process by introducing gallium and arsenic into the deposition chamber of the MBE apparatus. In response to this, the GaAs strip 23B is grown laterally starting from the edge of the NiAl strip 23A. It should be noted that the edge of the NiAl strip 23A forms a step and provides the site for nucleation and growth of the GaAs strip 23B in the direction of the arrows. When the GaAs strip 23B has reached the original edge of the step on the layer 22', the growth of the GaAs strip 23B is interrupted and the growth of the NiAl strip 23A is started again. By, by repeating the foregoing steps a number of times, the desired fractional superlattice layer 23' is formed on the GaAs layer 22'.

In the foregoing process, it should be noted that the formation of the fractional superlattice layer 23' is made within the same MBE apparatus that has been used for the growth of the GaAs layer 22' on the substrate 21. In other words, the formation of the fractional superlattice layer 23' to be used for the base structure 23 is achieved without breaking the vacuum and taking the device out of the MBE apparatus. In the MBE apparatus, the switching of the molecular beam is easily achieved by actuating the shutter mechanism.

Figure 7:
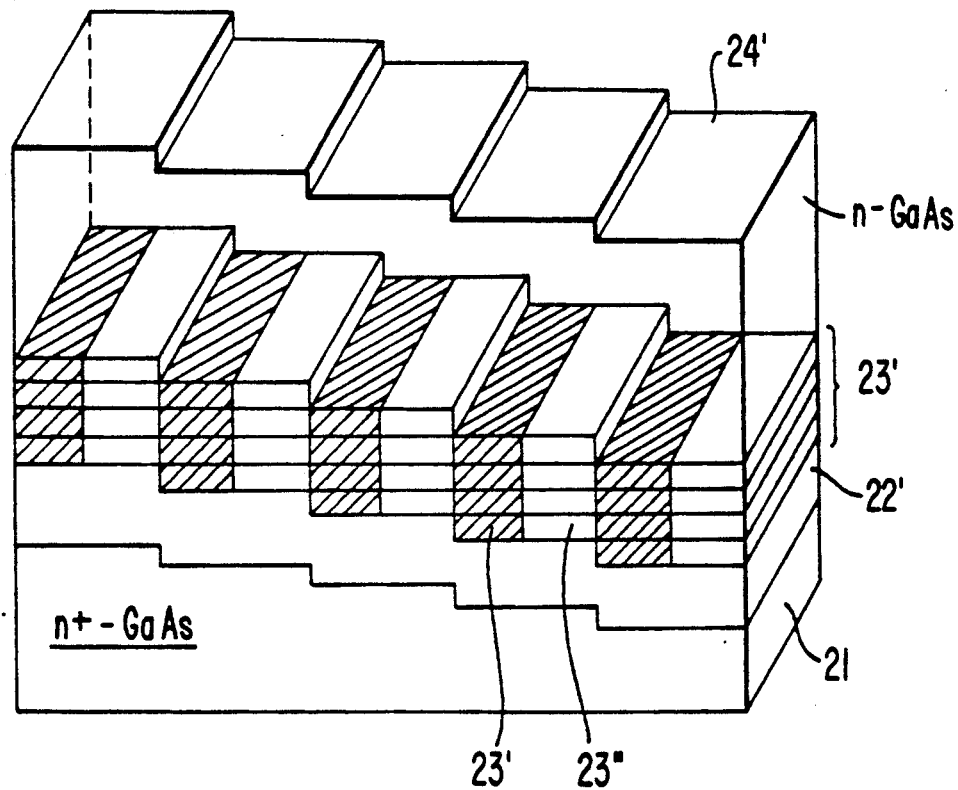
FIG. 7 is a diagram showing the structure of a layered semiconductor body forming the essential part of the transistor of FIG. 4.

Next, an n-type GaAs layer 24' is formed on the superlattice layer 23' by the MBE process with a thickness of 1 μm as shown in FIG. 7. The layer 23' is doped by silicon with the impurity concentration level of $3 \times 10^{16}$ cm$^{-3}$. Again, the growth of the layer 24' is made in the same MBE a without breaking vacuum or taking the partially formed device out of the MBE apparatus. As illustrated, the GaAs layer 24 has a stepped upper major surface in correspondence to the stepped upper major surface of the substrate 21. Thereby, the layered semiconductor body forming the essential part of the permeable base transistor of the present invention is formed. Further, the semiconductor body of FIG. 7 is subjected to a series of processes including the photolithographic patterning process to form the device structure shown in FIG. 4.

Next, the processes employed for forming the device structure of FIG. 4 starting from the layered semiconductor body of FIG. 7 will be described.

Figure 8A:
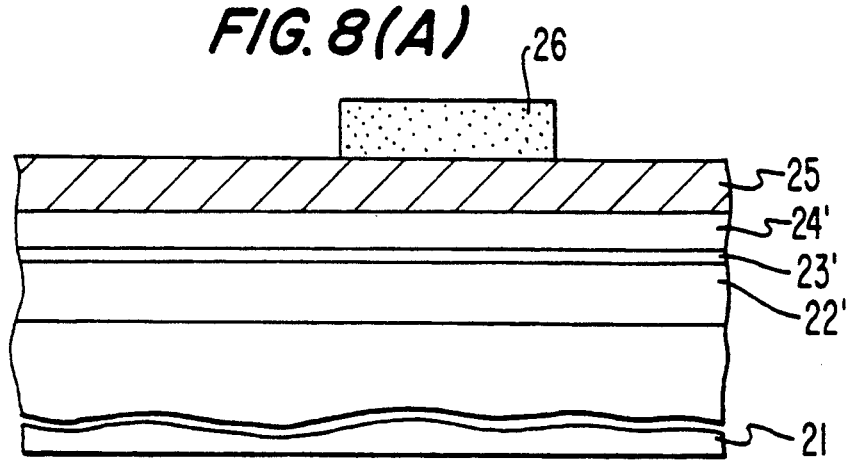
FIGS. 8(A)–8(F) are diagrams showing the process for forming the permeable base transistor of FIG. 4.

In a first step shown in FIG. 8(A), an insulator layer 25 of SiON is deposited by a CVD process with a thickness of about 3500 Å. Further, a photoresist 26 is formed on the insulator layer 25 to cover a region thereof corresponding to where the permeable base transistor is to be formed.

Figure 8B:
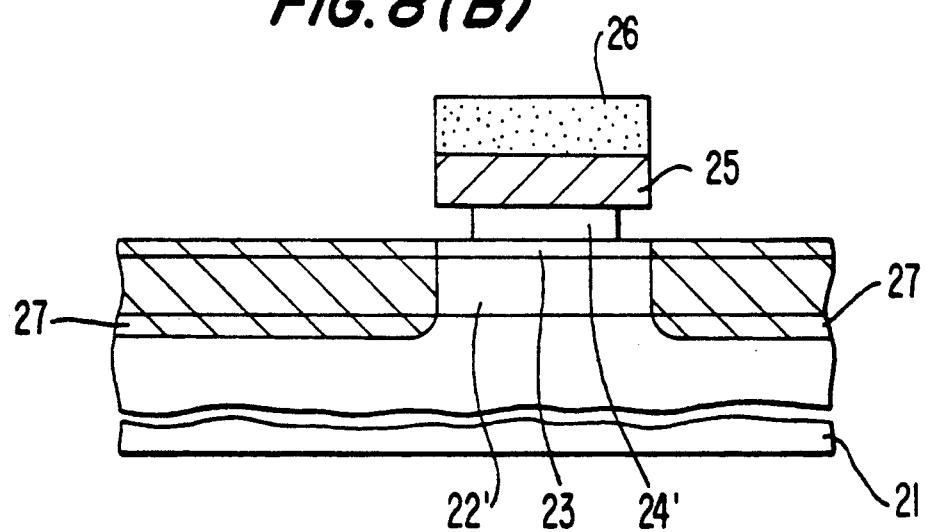

Next, a reactive ion etching process using a mixture of CF$_4$ and He as the etching gas is employed to remove the SiON insulator layer 25 except for those parts protected by the photoresist 26. Further, the etching gas is changed to a mixture of CCl$_2$F$_2$ and He to apply an isotropic etching of the GaAs layer 24'. In the latter process, the GaAs layer 24' is selectively etched while leaving the underlying superlattice layer 23' intact. Thereby, the GaAs layer 24' is etched laterally, leaving the collector region 24 as shown in FIG. 8(B). Further, the ion implantation of protons is made using the photoresist and the SiON layer 25 as the self-aligned mask to form the device isolation region 27 to surround the transistor. This ion implantation of protons may be achieved in four steps, first with the acceleration energy of 400 keV and the dose of $2 \times 10^{15}$ cm$^{-2}$, next with the acceleration voltage of 300 keV and the dose of $1.2 \times 10^{15}$ cm$^{-2}$, next with the acceleration voltage of 200 keV and the dose of $6 \times 10^{14}$ cm$^{-2}$, and finally with the acceleration voltage of 100 keV and the dose of $4 \times 10^{14}$ cm$^{-2}$.

Next, a wet etching process using an etching solution containing hydrofluoric acid is applied to the structure of FIG. 8(B) while leaving the photoresist 26 and the SiON region 25. Thereby, the superlattice layer 23' and the underlying GaAs layer 22' are selectively removed, leaving the mesa structure 23A as shown in FIG. 8(C).

Figure 8C:
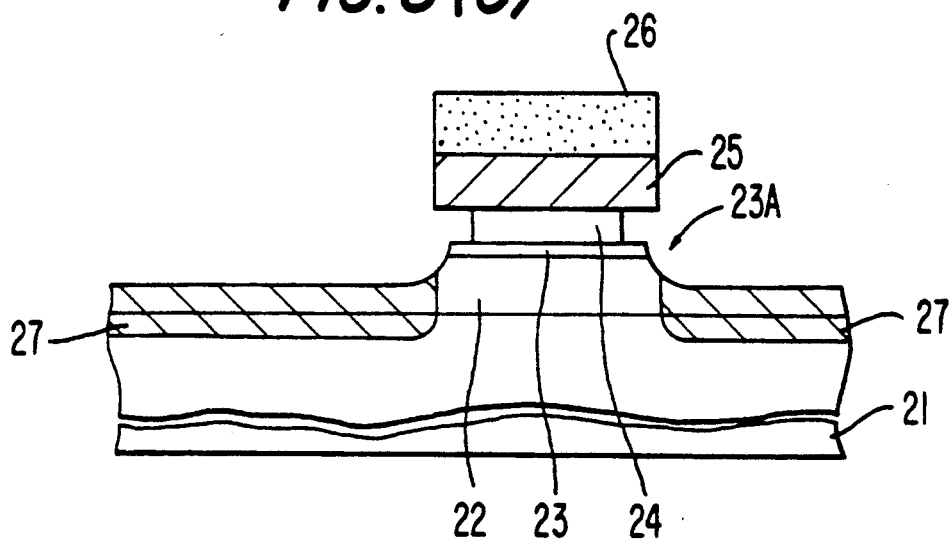
Figure 8D:
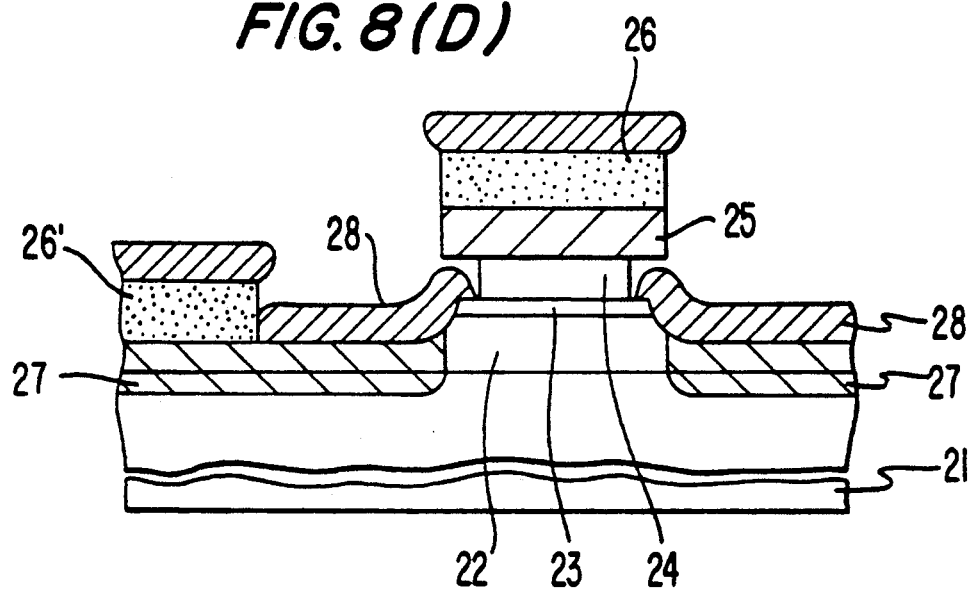
Figure 8:
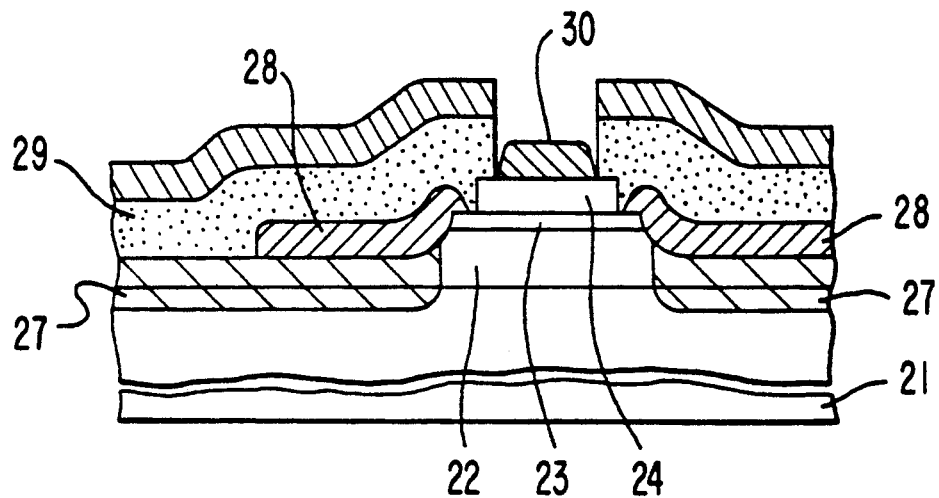
Figure 8:
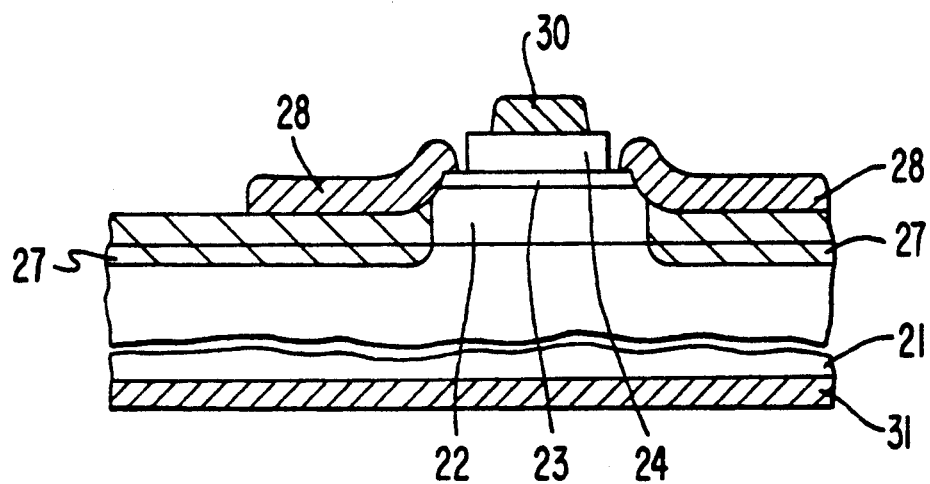

After the structure of FIG. 8(C) is formed, a photoresist 26' is provided on the structure of FIG. 8(C) with a window formed to expose the region where the base electrode 28 is to be formed, and a tungsten layer having a thickness of 0.2 μm is deposited on the entire surface of the structure by a sputtering process as shown in FIG. 8(D). Thereby, the base electrode 28 of tungsten is formed.

After the formation of the base electrode 28, the photoresist 26 and the photoresist 26' are lifted off together with the tungsten layer thereon, and another photoresist 29 is deposited on the entire surface of the structure thus obtained. The photoresist 29 is patterned subsequently to expose the region where the collector electrode 30 is to be formed, and a layer comprising gold, nickel and gold-germanium alloy (AuGe/Ni/Au) is deposited on the structure thus formed by a vacuum deposition process with a thickness of 0.2 μm as shown in FIG. 8(E). Thereby, the collector electrode 30 is formed.

Next, the photoresist 29 is dissolved in a solvent, and the gold alloy layer is removed by the lift-off process, leaving the collector electrode 30 on the collector region 24. Further, another layer of gold, nickel and gold-germanium alloy is deposited on the lower major surface of the substrate 21 as the emitter electrode 31 as shown in FIG. 8(F). The structure thus obtained is held at 450° C. for 1 minute to achieve the alloying of the collector and emitter electrodes. Thereby, the fabrication of the permeable base transistor of FIG. 4 is completed.

Figure 9:
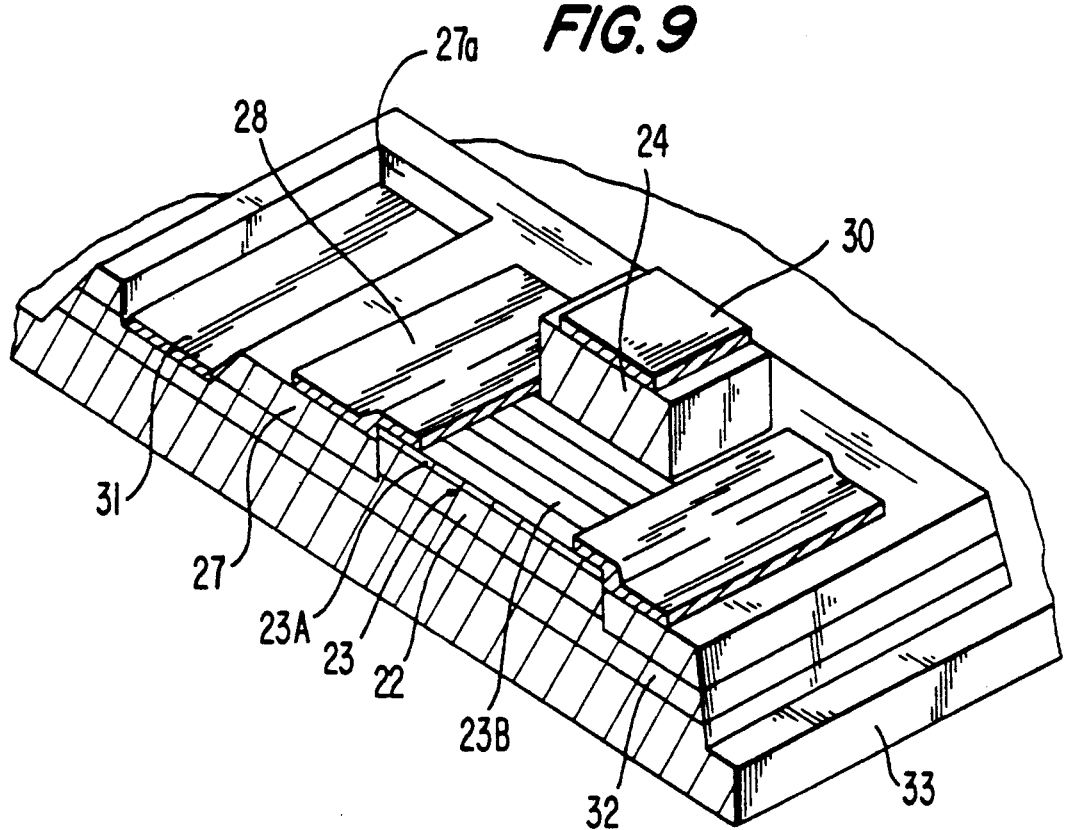
FIG. 9 is a diagram showing the perspective view of a modification of the transistor of FIG. 4.

FIG. 9 shows a modification of the transistor of FIG. 4. In FIG. 9, the parts that have been explained previously are designated by the same reference numerals and the description thereof will be omitted.

In this modification, the transistor is formed on an n+-type GaAs layer 32 that in turn is formed on a semi-insulating GaAs substrate 33. In this structure, the emitter region 22 is provided on the n+-type layer 32 instead of on the n+-type substrate 21. In correspondence to this modification, the isolation region 27 is formed on the n+-type GaAs layer 32. Further, a contact hole 27a is formed in the isolation region 27 to expose the underlying n+-type layer 32, and an emitter electrode 31 is provided in the contact hole 27a in contact with the GaAs layer 32. This structure, too has the base structure 23 described with reference to FIG. 4. As the operation and the fabrication process of this device are obvious from those described previously, further description about the present embodiment will be omitted.

Next, a second embodiment of the present invention will be described.

Figure 10:
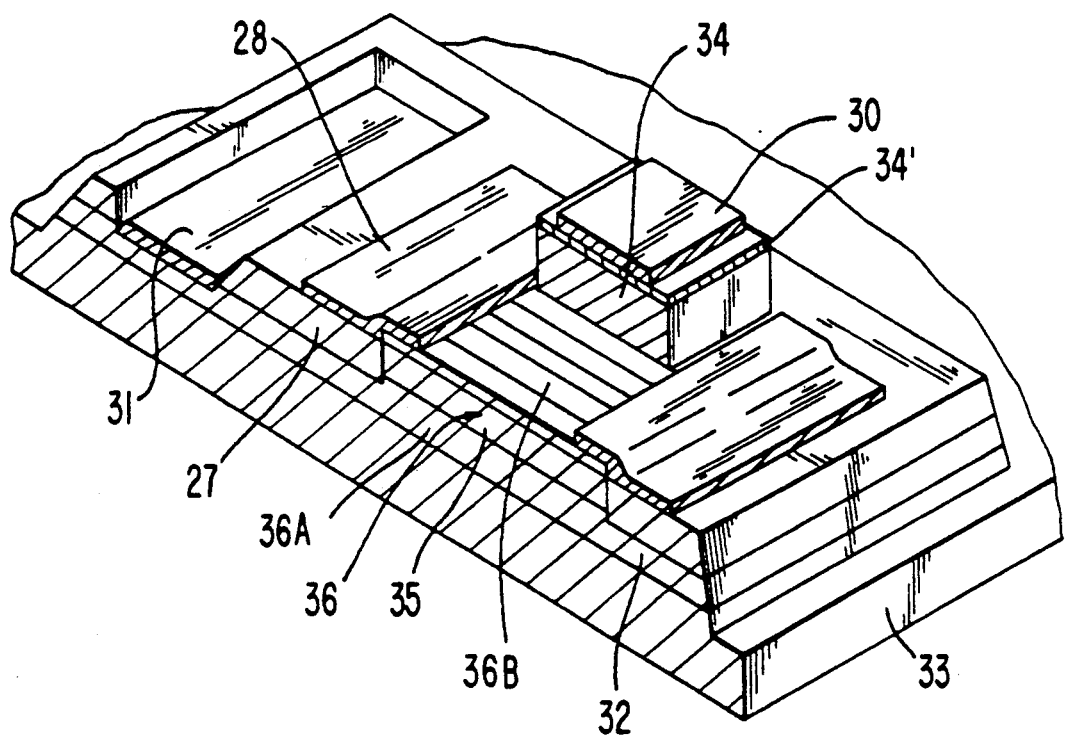
FIG. 10 is a diagram showing a static induction transistor according to a second embodiment of the present invention.

FIG. 10 shows a static induction transistor according to the second embodiment of the present invention. In FIG. 10, those parts that have been explained with reference to previous drawings are identified by the same reference numerals and a description thereof will be omitted.

Referring to FIG. 10, the transistor has a structure substantially identical with the structure of the permeable base transistor of FIG. 9 except for the composition of the base structure that is designated by a reference numeral 36 and the composition of the emitter and collector regions designated respectively by a numeral 35 and 34. Further, in order to secure a reliable ohmic contact between the electrode 30 and the collector region 34, an n+-type GaAs layer 34' is interposed. This layer 34' may be doped by silicon with the impurity concentration level of $1 \times 10^{18}$ cm$^{-3}$ and grown by the MBE process consecutively to the growth of the collector region 34 with the thickness of 1000 Å. Thereby, the emitter region 36 and the collector region 34 comprise undoped GaAs and have a stepped upper major surface similar to the emitter and collector regions 22 and 24. The base structure 36 comprises a fractional superlattice layer similar to the base structure 23. The fractional superlattice layer is formed from an alternate repetition of a p-type GaAs strip 36A and an undoped GaAs strip 36B extending parallel with each other on each step of the upper major surface of the emitter region 36.

Figure 11:
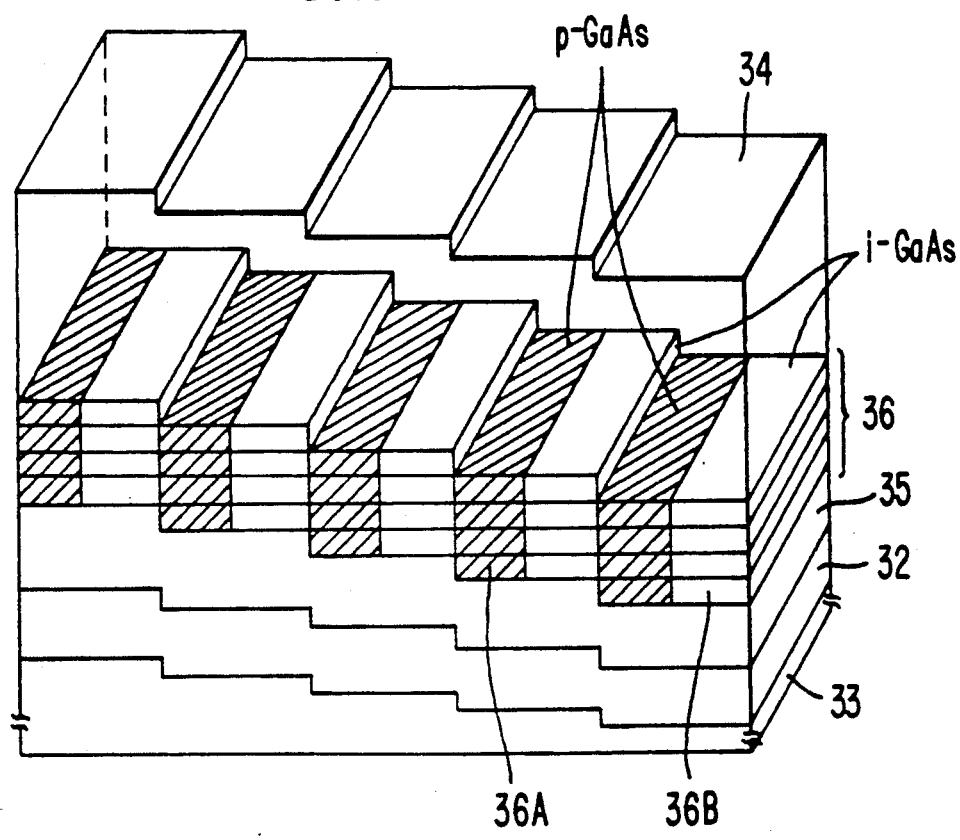
FIG. 11 is a diagram showing the structure of a layered semiconductor body forming the essential part of the static induction transistor of FIG. 10.

FIG. 11 shows the base structure in detail. As the construction and fabrication process of this structure is substantially identical with those described previously except for the molecular species used in the MBE process, further description will be omitted. In this transistor, the undoped GaAs strips 36B provide the channel of electrons flowing from the emitter region 35 to the collector region 34, and the flow of electrons is controlled by the p-type GaAs strips 36A. See Nishizawa et al. (op. cit). The growth of the p-type strips 36B may be made by the MBE process with the dopant of magnesium incorporated with the impurity concentration level of $5 \times 10^{18}$ cm$^{-3}$.

Figure 12:
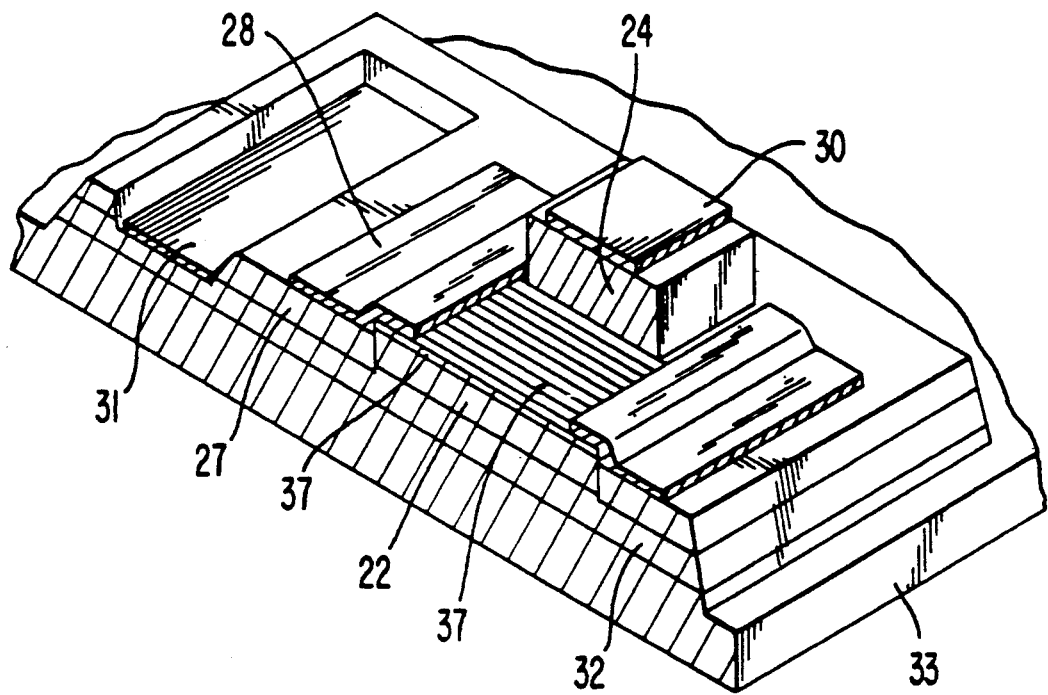
FIG. 12 is a diagram showing a high-electron-mobility permeable base transistor according to a third embodiment of the present invention.

FIG. 12 shows a third embodiment of the present invention. In FIG. 12, those parts that have been described previously with reference to preceding drawings are designated by the same, corresponding reference numerals and the description will be omitted.

Referring to FIG. 12, the device of the present embodiment has a structure substantially identical with the structure of FIG. 9 except for the construction of the permeable base that is now designated by the reference numeral 37.

Figure 13:
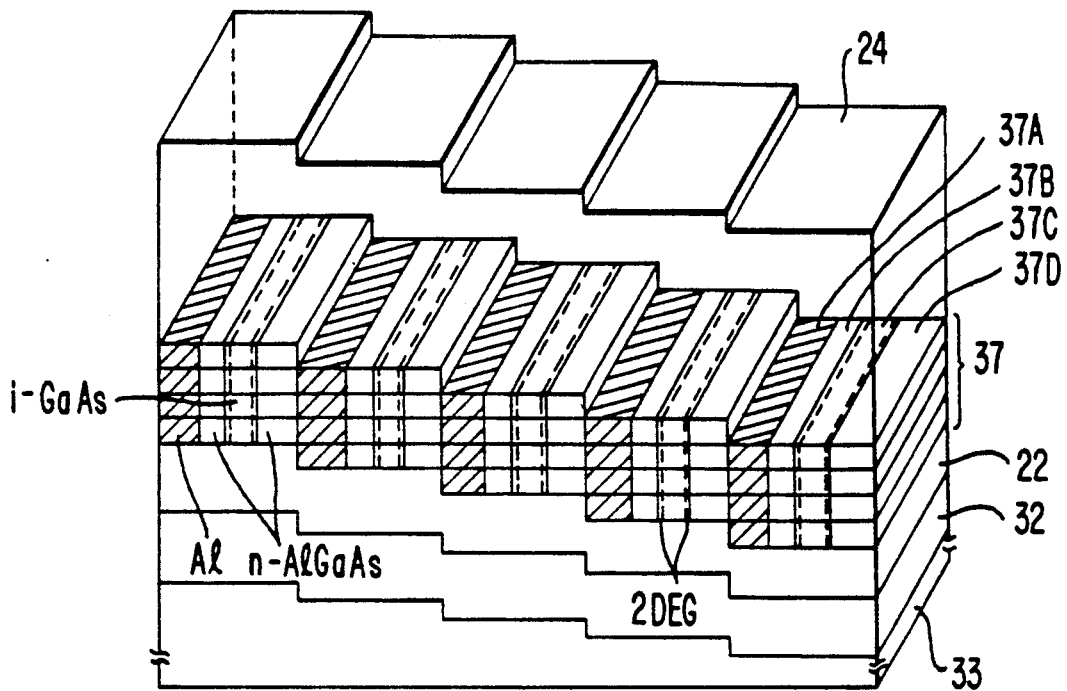
FIG. 13 is a diagram showing a layered semiconductor body forming the essential part of the high-electron-mobility permeable base transistor of FIG. 12.

FIG. 13 shows the permeable base 37 in detail. Referring to FIG. 13, the permeable base 37 has a fractional superlattice structure wherein there are four parallel strip regions 37A–37D extending parallel with each other on each step of the upper major surface of the emitter region 22. The strip regions 37A–37D are stacked laterally and consecutively on each step with the boundary surface extending vertically to the surface of the step.

Figure 3:
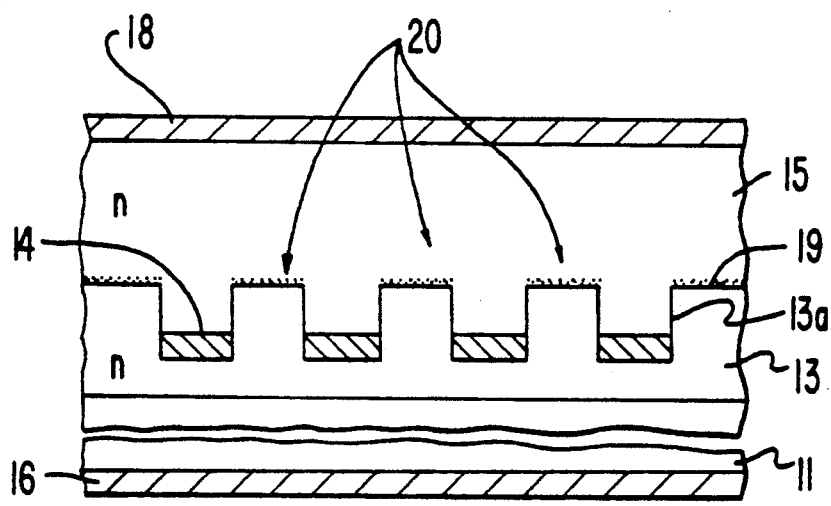
FIG. 3 is a diagram showing the cross-sectional view of another conventional permeable base transistor.

Referring to FIG. 13, the strip region 37A located immediately adjacent to the edge to the upper step comprises aluminum, and the strip region 37B adjacent thereto comprises n-type AlGaAs that is doped by Si with the impurity concentration level of $1.5 \times 10^{18}$ cm$^{-3}$. Further, the strip region 37C comprises undoped GaAs and the strip region 37D comprises n-type AlGaAs. In this structure where the strip region 37C of GaAs is laterally sandwiched by the strip regions 37B and 37D of AlGaAs having an electron affinity that is smaller than the electron affinity of GaAs, there is formed a two-dimensional electron gas in the undoped GaAs region 37C along the both lateral boundary surfaces to the strip region 37B and the strip region 37D as shown in FIG. 3 by 2DEG. On the permeable base 37 thus formed, the collector region 24 is deposited as illustrated, and the device operates as a HEMT (high-electron-mobility transistor). Thereby, the two-dimensional electron gas 2DEG serves for the channel extending vertically between the emitter region 22 and the collector region 24. According to the present embodiment, the number of channels of HEMT is increased and a high-power and high-speed transistor is obtained.

It should be noted that, in any of the foregoing embodiments, the formation of the layered semiconductor body forming the essential part of the device is made in the same deposition apparatus, without taking out the layered semiconductor body from the apparatus during its growth.

Further, the present invention is not limited to the embodiments described heretofore, and various variations and modifications may be made without departing from the scope of the invention.

What is claimed is:

1. A method for fabricating a semiconductor device, comprising the steps of:
   providing a substrate having a stepped upper major surface;
   growing a semiconductor material epitaxially on the stepped upper major surface of the substrate as an emitter layer, said emitter layer releasing carriers, said step of growing the emitter layer being achieved in a crystal growth apparatus;
   forming a base layer comprising a plurality of regions of different compositions on the stepped upper major surface of the substrate, said plurality of regions including a channel of the carriers that have been released by the emitter layer, said step of forming the base layer being achieved in said same crystal growth apparatus such that said plurality of regions are repeated in each step of the stepped upper major surface of the emitter layer and such that each region extend from a lower major surface of the base layer to an upper major surface of the base layer; and growing a semiconductor material epitaxially on an upper major surface of the base layer as a collector layer, said collector layer collecting the carriers passed through the base layer, said step of growing the semiconductor material being achieved in the same crystal growth apparatus.

2. A method as claimed in claim 1 in which said step of forming the base layer comprises the steps of growing the regions of different compositions consecutively in each step forming the stepped upper major surface of the emitter layer from a first edge of the step to an opposing, second edge of the step, along an upper major surface of the step.

* * * * *

UNITED STATES PATENT AND TRADEMARK OFFICE
CERTIFICATE OF CORRECTION

PATENT NO. : 5,296,390
DATED : March 22, 1994
INVENTOR(S) : AWANO

It is certified that error appears in the above-indentified patent and that said Letters Patent is hereby corrected as shown below:

Col. 5, line 6, change "$5 \times 10^{16} cm^{31\ 3}$" to --$5 \times 10^{18} cm^{-3}$--;
line 49, delete ", by".

Signed and Sealed this

Twentieth Day of December, 1994

Attest:

BRUCE LEHMAN

*Attesting Officer*   *Commissioner of Patents and Trademarks*